(12) United States Patent
Karsten (10) Patent No.: US 10,469,042 B1
(45) Date of Patent: Nov. 5, 2019

(54) AUDIO AMPLIFIER CIRCUIT

(71) Applicant: Ralph R. Karsten, St. Paul, MN (US)

(72) Inventor: Ralph R. Karsten, St. Paul, MN (US)

( * ) Notice: Subject to any disclaimer, the term of this patent is extended or adjusted under 35 U.S.C. 154(b) by 0 days.

(21) Appl. No.: 15/979,166

(22) Filed: May 14, 2018

(51) Int. Cl.
| H03F 3/38 | (2006.01) |
| H03F 3/217 | (2006.01) |
| H03F 1/30 | (2006.01) |
| H03F 3/28 | (2006.01) |

(52) U.S. Cl.
CPC ............. *H03F 3/217* (2013.01); *H03F 1/307* (2013.01); *H03F 3/28* (2013.01)

(58) Field of Classification Search
CPC .................................. H03F 3/38; H03F 3/217
USPC ........................................ 330/10, 207 A, 251
See application file for complete search history.

(56) References Cited

U.S. PATENT DOCUMENTS

| 2,877,310 | A |   | 3/1959  | Donald   |             |
|-----------|---|---|---------|----------|-------------|
| 3,585,517 | A |   | 6/1971  | Herbert  |             |
| 4,162,455 | A |   | 7/1979  | Birt     |             |
| 4,719,431 | A |   | 1/1988  | Karsten  |             |
| 5,963,086 | A |   | 10/1999 | Hall     |             |
| 6,242,977 | B1| * | 6/2001  | Karsten  | H03F 3/181  |
|           |   |   |         |          | 330/127     |
| 6,747,513 | B1| * | 6/2004  | Berry    | H03F 3/3059 |
|           |   |   |         |          | 330/146     |
| 7,701,307 | B2| * | 4/2010  | Beale    | H03F 1/26   |
|           |   |   |         |          | 330/10      |
| 7,714,646 | B2| * | 5/2010  | Li       | H03F 3/2173 |
|           |   |   |         |          | 330/10      |
| 7,843,263 | B2| * | 11/2010 | Wu       | H03F 3/2171 |
|           |   |   |         |          | 330/10      |
| 7,948,313 | B2| * | 5/2011  | Tsuji    | H03F 3/2173 |
|           |   |   |         |          | 330/10      |
| 8,022,756 | B2| * | 9/2011  | Walker   | H03F 3/217  |
|           |   |   |         |          | 330/10      |
| 8,472,644 | B2| * | 6/2013  | Chen     | H03F 3/2173 |
|           |   |   |         |          | 330/10      |

(Continued)

OTHER PUBLICATIONS

Nguyen-Duy, Khiem; Knott, Arnold; Anderson, Michael A. E., (2014) "Constant Switching Frequency Self-Oscillating Controlled Class-D Amplifiers", Elektronika ir Elektrotechnika, 20(6), 84-88. DOI 10.5755/j01.eee.20.6.7273.

(Continued)

*Primary Examiner* — Henry Choe
(74) *Attorney, Agent, or Firm* — Kinney & Lange, P.A.

(57) ABSTRACT

Apparatus and associated methods relating to the amplification of an audio signal. In particular, such application is performed by using an audio to pulse train converter configured to convert an analog audio signal to a complementary train of pulses having a duty cycle indicative of the level of the analog audio signal. The audio to pulse train converter can be a class-D amplifier, a sigma-delta amplifier, self-oscillating amplifier, or any other audio amplifier that is configured to provide complementary pulse trains each having a duty cycle that is representative of the input audio signal. The complementary pulse trains are directed to a circlotron that is configured to provide an amplified version of the audio signal at two output nodes. The amplifier circuit may further include one or more low pass filters and/or output reference resistors. Two similar circuits can be configured together to provide stereo audio amplification.

20 Claims, 7 Drawing Sheets

(56) References Cited

U.S. PATENT DOCUMENTS 8,502,602 B2 * 8/2013 Hirano .................... H03F 3/217
　　　　　　　　　　　　　　　　　　　　　　330/10
8,744,378 B2 * 6/2014 Hur ...................... H04B 1/0475
　　　　　　　　　　　　　　　　　　　　　　330/10

OTHER PUBLICATIONS

Wikipedia, "Buck converter" "https://en.wikipedia.org/w/index.php?title=Buck_converter&oldid=802038360" accessed May 14, 2018.
Wikipedia "Circlotron" "https://en.wikipedia.org/w/index.php?title=Circlotron&oldid=685829163" accessed May 14, 2018.
Wikipedia "Class-D amplifier" "https://en.wikipedia.org/w/index.php?title=Class-D_amplifier&oldid=803492414" accessed May 14, 2018.
Wikipedia "Delta-sigma modulation" "https://en.wikipedia.org/w/index.php?title=Delta-sigma_modulation&oldid=810828823" accessed May 14, 2018.

* cited by examiner

AUDIO AMPLIFIER CIRCUIT

BACKGROUND

Electronic signal amplifier circuits are used for a variety of purposes. For example, they can operate as an audio frequency preamplifier that boosts the magnitude of signals obtained from an audio source, or from an instrumentation source having an audible frequency range. Some audio frequency power amplifiers can be directly connected to an input source and/or an output without use of capacitors or coupling transformers. Audio signal amplifiers can also be used as power amplifiers that boost the magnitude of audio frequency signals obtained from a preamplifier.

Preamplifiers and power amplifiers for audio frequency signals have been used for these and various other functions. For example, U.S. Pat. No. 4,719,431 granted to Karsten in January 1988, and U.S. Pat. No. 6,242,977 granted to Karsten in June 2001, both disclose power amplifiers. Some preamplifiers have been shown to be advantageous in being capable of transferring output signals therefrom over a balanced line interconnection arrangement directly connected to its output. For example, the so called "Circlotron" circuit is such a high performance preamplifier.

SUMMARY

According to one embodiment of the present disclosure, a system for producing amplification of an audio signal, including an analog to pulse train converter configured to convert an analog audio signal to a complementary train of pulses indicative of the analog audio signal, the analog to pulse train converter receiving the analog signal at an input port and providing the complementary train of pulses at an output port; and a circlotron having two active devices, two power supplies, two complementary input terminals, and two complementary output nodes, where each of the active devices has a control node in conductive communication with a respective one of the complementary input terminals, the complementary input terminals are configured to receive the complementary train of pulses, and the circlotron is configured to provide, based on the complementary train of pulses, an amplified version of the audio signal at the two output nodes.

According to another embodiment of the present disclosure, a method for producing amplification of an audio signal, including the steps of: supplying a first audio signal and a first triangle wave signal to a first audio to pulse train converter; generating, by the first audio to pulse train converter, based on the received first audio frequency signal and the first triangle wave signal, a first pulse train signal indicative of the first audio signal; supplying a second audio signal and a second triangle wave signal to a second audio to pulse train converter; generating, by the second audio to pulse train converter, based on the received second audio frequency signal and the second triangle wave signal, a second pulse train signal indicative of the second audio signal; amplifying, by a circlotron, an amplified version of the audio signal based on a difference between the first pulse train signal and the second pulse train signal; and outputting, from the circlotron, an amplified version of the audio signal.

According to another embodiment of the present disclosure, a system for producing amplification of a stereo audio signal, the system configured to amplify a left audio signal and a right audio signal, the system including a left channel amplifier and a right channel amplifier, each of the two channel amplifiers including: an analog to pulse train converter configured to convert an analog audio signal to a complementary train of pulses indicative of the analog audio signal, the analog to pulse train converter receiving the analog signal at an input port and providing the complementary train of pulses at an output port; and a circlotron having two active devices, two power supplies, two complementary input terminals, and two complementary output nodes, where each of the active devices has a control node in conductive communication with a respective one of the complementary input terminals, the complementary input terminals are configured to receive the complementary train of pulses; and the circlotron is configured to provide, based on the complementary train of pulses, an amplified version of the audio signal at the two output nodes.

DETAILED DESCRIPTION

Figure 1:
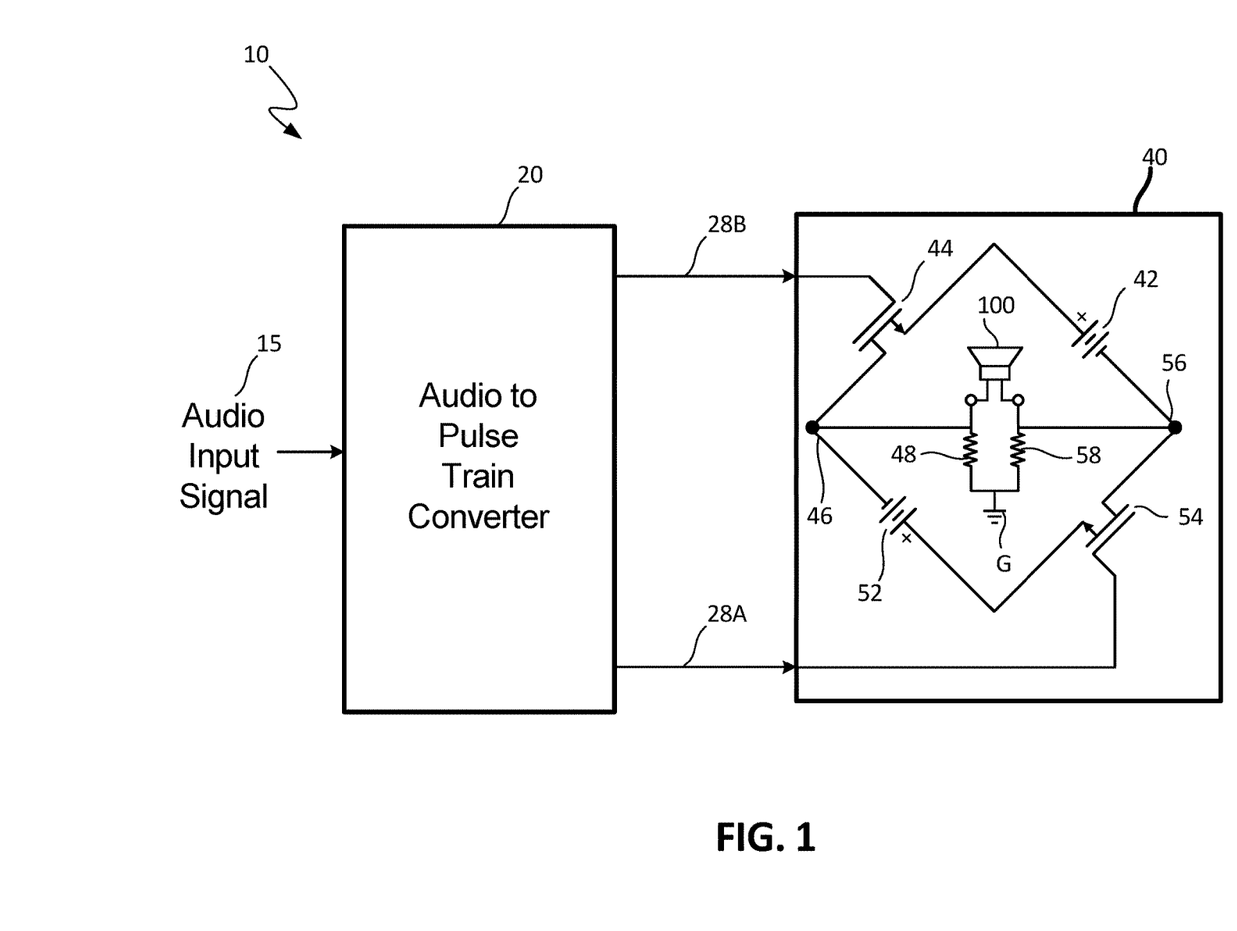
FIG. 1 is a block diagram of the preamplifier/amplifier circuit.

FIG. 1 is a block diagram representation of a preamplifier/amplifier circuit. Shown in FIG. 1 are audio amplifier circuit 10, audio input signal 15, audio to pulse train converter 20, complementary pulse train outputs 28A and 28B, circlotron 40, floating power supply 42, active device 44, first output node 46, first output reference resistor 48, floating power supply 52, active device 54, second output node 56, second output reference resistor 58, ground point G, and audio transducer 100. Audio input signal 15 may be any audio signal including, without limitation, speech, singing, music, or sounds of nature, human, animal, or industrial origin. In some embodiments, the audio frequency signal may range from 0-50 KHz. In one embodiment, for example, the audio frequency signal may range from 20 Hz-20 KHz. Audio to pulse train converter 20 depicts a circuit that can be used to provide high-efficiency amplification of an audio signal by producing a complementary pair of pulse trains that are representative of the audio signal being amplified. For example, in one embodiment, audio to pulse train converter 20 can be a pulse-width modulation amplifier circuit. This embodiment can also be called a class-D amplifier. In another embodiment, audio to pulse train converter 20 can be a sigma-delta amplifier circuit. In yet another embodiment, audio to pulse train converter 20 can be a self-oscillating amplifier circuit. These examples of various embodiments of audio to pulse train converter 20 are not limiting, and those who are skilled in the electrical arts are familiar with the various types of audio to pulse train converters 20 that can be used as power amplifiers. Audio input signal 15 is applied to the input of audio to pulse train converter 20. Audio to pulse train converter 20 has two outputs, complementary pulse train output 28A and pulse train output 28B. Complementary pulse train output 28A is a complement, or an inverse signal, of pulse train output 28B, with each being a high-frequency pulse train representing an amplified version of audio input signal 15. Audio to pulse train converter 20 can be used as a power amplifier, while having an electrical efficiency that can be superior to that of other power amplifier circuits.

Circlotron 40 represents a "bridge" circuit having a first and second leg. The first leg of circlotron 40 includes floating power supply 42, active device 44, first output node 46, and first output reference resistor 48. The second leg of circlotron 40 includes floating power supply 52, active device 54, second output node 56, and second output reference resistor 58. Ground point G represents a common ground point, which can be a chassis ground. In some embodiments, ground point G can be an earth ground. In other embodiments, ground point G can be a floating ground within audio amplifier circuit 110.

Circlotron 40 typically receives, during operation, two balanced input voltage signals, complementary pulse train output 28A and pulse train output 28B, with complementary pulse train output 28A being a complement, or an inverse signal, of pulse train output 28B. For simplicity, this description excludes any bias voltage level that is required by active devices 44 and 54. Pulse train output 28B is received from audio to pulse train converter 20 and is applied to the control terminal of active device 44. Complementary pulse train output 28A is received from audio to pulse train converter 20 and is applied to the control terminal of active device 54. In the illustrated embodiment, active devices 44 and 54 may be metal oxide semiconductor field effect transistors (MOSFETs), and the control terminals are the gates of the MOSFETs. In other embodiments, active devices 44 and 54 may be bipolar transistors, and the controls are the bases of the bipolar transistors. In other embodiments, active devices 44 and 54 may be vacuum tubes, and the control terminals are the grids of the vacuum tubes. Despite the widespread replacement of vacuum tubes by semiconductor devices beginning in the 1950's and 1960's, many modern day audiophiles can appreciate the sound quality produced by amplifiers which contain vacuum tubes. Therefore, an embodiment of the present disclosure can include vacuum tubes for active devices 44 and 54.

During the operation of circlotron 40, when pulse train output 28B is relatively high, complementary pulse train output 28A is relatively low, the control terminal of active device 44 has a relatively high voltage signal such that current increases through active device 44 to first output node 46, and the control terminal of active device 54 has a relatively low voltage signal such that current decreases through active device 54 to second output node 56. Accordingly, a voltage potential will exist between first output node 44 and second output node 46, and current will flow through audio transducer 100 from first output node 44 to second output node 46. Circlotron 40 operates to amplify the difference between the first input signal and the second input signals, thereby providing a substantial differential current gain. First output reference resistor 48 is connected between first output node 46 and ground point G, and second output reference resistor 58 is connected between second output node 56 and ground point G. First output reference resistor 48 and second output reference resistor 58 can have approximately equal values for balanced operation. First output reference resistor 48 and second output reference resistor 58 permit an output level measurement to be made, such as on a volume unit (VU) meter (not shown). In other embodiments, first output reference resistor 48 and/or second output reference resistor 58 can be omitted.

Shown in FIG. 1 is audio transducer 100. The present disclosure is directed at audio amplifier circuit 10, which can exclude audio transducer 100. Accordingly, the output of audio amplifier circuit 10 is present across first output node 46 and second output node 56. In an embodiment, first output node 46 and second output node 56 can be lugs or posts. In other embodiments, first output node 46 and second output node 56 can be an output jack. In one embodiment, audio transducer 100 can be a speaker, a loudspeaker, or a headphone. In some embodiments, first output node 46 and second output node 56 can be coupled to the input of an amplifier circuit, thereby utilizing audio amplifier circuit 10 as a preamplifier.

Some embodiments of audio amplifier circuit 10 can have desirable characteristics such as wide frequency bandwidth, and/or fast transient response, and/or low total distortion for reasons set out below. Similarly, such designs can have desirable characteristics in preamplifier applications including wide frequency bandwidth, low total distortion, the ability to transfer output signals over relatively long interconnection cables, good reliability, and/or with or at low cost.

Such designs can achieve wide frequency bandwidth because they can have relatively simple designs that use relatively small numbers of components. The use of relatively small numbers of components can permit such circuit designs to have low parasitics. Such designs can have fast transient responses because the relatively low distortion of such designs can permit avoiding negative output signal feedback to correct distortion. Negative feedback can introduce significant damping that can inhibit transient response, and can also contribute distortion of its own. Also, low total distortion can be achieved because the voltage potential across the load is limited to the substantially linear portion of the operating ranges of the active circuit devices. Furthermore, because the two balanced input voltage signals at the input to circlotron 40 are complementary to each other, the effects of certain distortions can be balanced, and thus cancelled. The complementary balanced input signals can also cancel the effects of external interference and/or power supply noise. Moreover, audio amplifier circuit 10 can provide an output signal to its load through relatively long interconnection cables because of its relatively high current gain and relatively low output impedance.

In the illustrated embodiment, active devices 44 and 54 in circlotron 40 each operate with a separate current path because active devices 44 and 54 are not in series with each other, thereby avoiding shoot-through current. Other embodiments of audio amplifier circuit 10 that avoid shoot-through current can also be used. For example, in an alternative embodiment circlotron 40 can have an H-bridge circuit configuration, thereby also avoiding shoot-through current.

The complementary dual circuit design of the present disclosure will be used to amplify a single audio channel or track. In some embodiments, a high-fidelity audio system can employ two audio channels, known as stereo audio, with what may be referred to as a left and a right sound track. Accordingly, a stereo audio amplifier can utilize two independent audio amplifier circuits 10 of the present disclosure. In another embodiment, an audio system can utilize four audio channels and may be known as a quad-channel audio system. Accordingly, a quad-channel audio amplifier can utilize four independent audio amplifier circuits 10 of the present disclosure. Any number of audio circuits or tracks, each utilizing audio amplifier circuit 10, is within the scope of the present disclosure.

Figure 2:
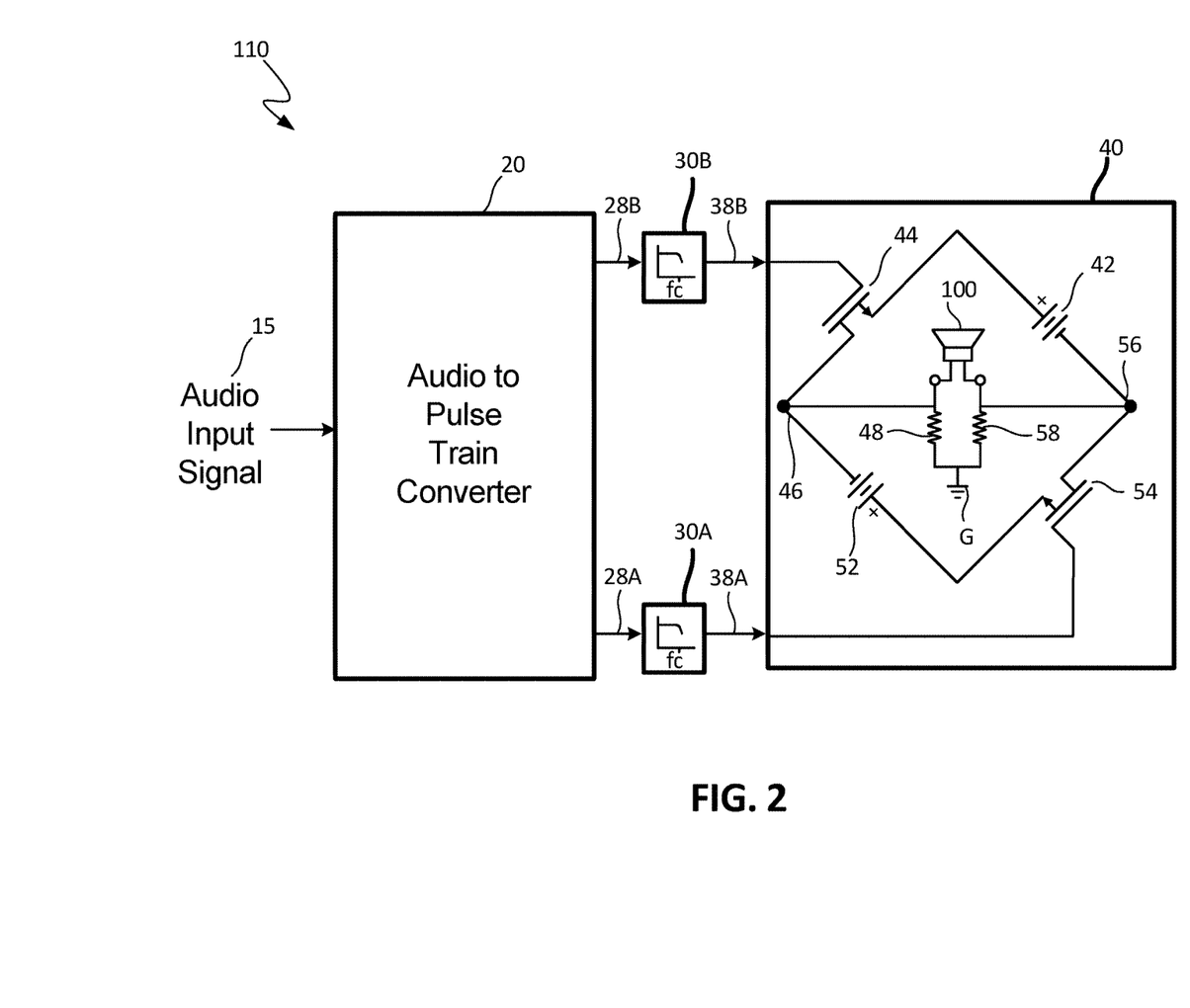
FIG. 2 is a block diagram of a second embodiment of the preamplifier/amplifier circuit.

FIG. 2 is a block diagram representation of a second embodiment of the preamplifier/amplifier circuit. Shown in FIG. 2 are audio amplifier circuit 110, audio input signal 15, audio to pulse train converter 20, complementary pulse train output 28A, pulse train output 28B, low-pass filters 30A, 30B, circlotron 40, floating power supply 42, active device 44, first output node 46, first output reference resistor 48, floating power supply 52, active device 54, second output node 56, second output reference resistor 58, ground point G, and audio transducer 100. Audio amplifier circuit 110 can be substantially similar to audio amplifier circuit 10 shown in FIG. 1, with the difference being the placement of low pass filters 30A, 30B in the output paths of circlotron 40. In the illustrated embodiment, complementary pulse train output 28A is electrically connected to low-pass filter 30A. Low-pass filter 30A can include a single inductor-capacitor (L-C) network, with values of inductance and capacitance selected to produce band-pass cut-off frequency fc. Band-pass cut-off frequency fc is selected to permit low frequency components to pass through low-pass filter 30A, while blocking the high frequency components of the signal received by low-pass filter 30A that are related to the audio to pulse train converter 20. In the illustrated embodiment, low-pass filter 30A prevents or minimizes the passage of high frequency components from entering cyclotron 40, thereby preventing or minimizing excessive current flow from switching transients that could otherwise occur in cyclotron 40 and/or audio transducer 100. When a single inductor-capacitor is used as low-pass filter 30A, the cut-off frequency may be calculated as follows:

$fc=1/(2\pi sqrt(LC))$, where L is inductance (in Henrys) and C is capacitance (in Farads).     Equation 1:

In other embodiments, low-pass filter 30A can include components other than a single inductor-capacitor (L-C) network. In some embodiments, low-pass filter 30A can include only a single inductor, for example. In other embodiments, low-pass filter 30A can include only a single capacitor, for example.

In a similar fashion as disclosed above, pulse train output 28B is electrically connected to low-pass filter 30B. In the illustrated embodiment, low-pass filter 30B can be a similar or substantially identical circuit to low-pass filter 30A. Accordingly, low-pass filter 30B will also have band-pass cut-off frequency fc, as described above in relation to low-pass filter 30A.

In other embodiments, for example, as shown in FIG. 1, low-pass filters 30A and 30B can be omitted. In yet other embodiments, a single low-pass filter 30A or 30B can be used in an output path from circlotron 40. As will be seen in FIGS. 4A and 4B, a high-frequency pulse train can be output from audio to pulse train converter 20. In some embodiments, it can be beneficial to block or attenuate the high frequency component of signals at the output of audio to pulse train converter 20. In other embodiments it may not be necessary to use low-pass filters 30A and 30B for a number of possible reasons, with non-limiting examples being provided as follows. For example, if the maximum frequency response of audio transducer 100 in one embodiment is less than the high-frequency component of signals produced in audio to pulse train converter 20, then use low-pass filters 30A and 30B may be unnecessary. For example, in an embodiment such as that shown in FIG. 1, if parasitic values of inductance and capacitance within audio amplifier circuit 10 may be sufficient to block the high frequencies that are associated with the high frequency component of signals at the output of audio to pulse train converter 20, then low-pass filters 30A and 30B may not be necessary. Accordingly, in an embodiment where audio amplifier circuit 10 can omit low-pass filters 30A and 30B, the resulting advantages can include reduced size, reduced weight, and/or reduced cost of audio amplifier circuit 10.

Figure 3:
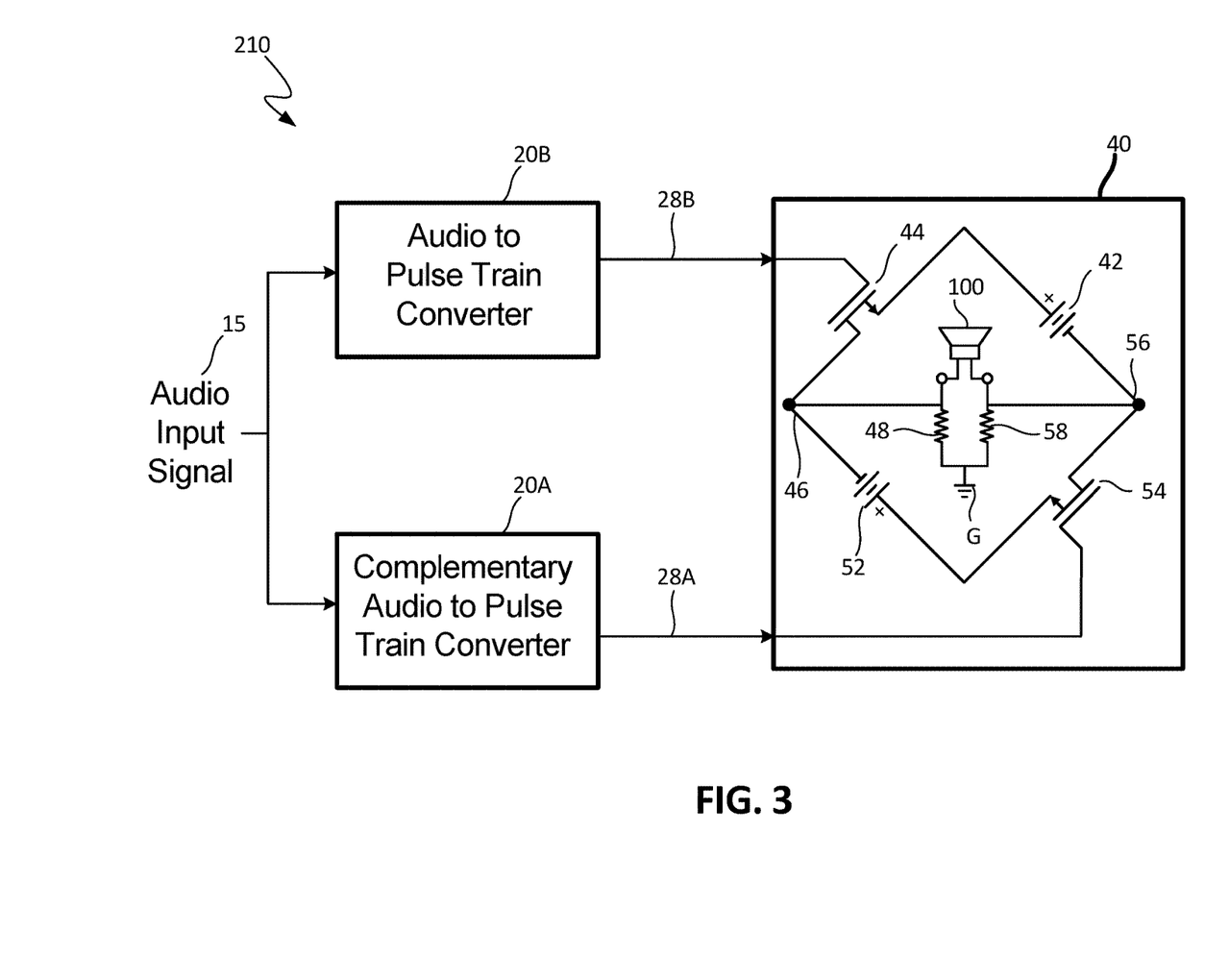
FIG. 3 is a block diagram of a third embodiment of the preamplifier/amplifier circuit.

FIG. 3 is a block diagram representation of a third embodiment of the preamplifier/amplifier circuit. Shown in FIG. 3 are audio amplifier circuit 210, audio input signal 15, complementary audio to pulse train converter 20A, audio to pulse train converter 20B, complementary pulse train output 28A, pulse train output 28B, circlotron 40, floating power supply 42, active device 44, first output node 46, first output reference resistor 48, floating power supply 52, active device 54, second output node 56, second output reference resistor 58, ground point G, and audio transducer 100. Audio amplifier circuit 210 can be substantially similar to audio amplifier circuit 10 shown in FIG. 1, with the difference being the use of two separate circuits performing the function of audio to pulse train converter 20 as shown in FIG. 1. Referring to FIG. 3, complementary audio to pulse train converter 20A provides complementary pulse train output 28A, and audio to pulse train converter 20B provides pulse train output 28B, being substantially similar to complementary pulse train output 28A and pulse train output 28A as described in FIG. 1. The functioning of circlotron 40 in audio amplifier circuit 210 is substantially similar to that described in FIG. 1. In a different embodiment, audio amplifier circuit 210 can further include one or both low-pass filters 30A and/or 30B, as described in FIG. 2.

Figure 4A:
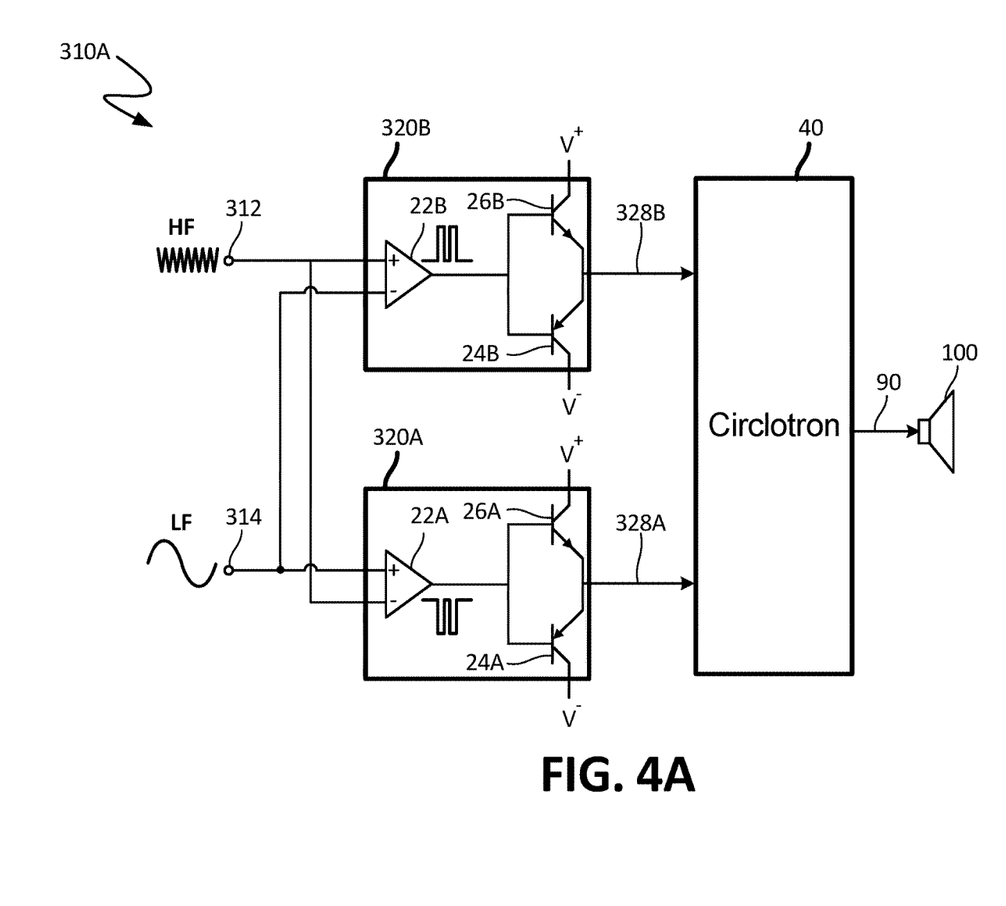
FIG. 4A is a schematic diagram of a first embodiment of the audio to pulse train converter circuit depicted in FIG. 3.

FIG. 4A is a schematic diagram of a first embodiment of audio to pulse train converter 20B and complementary audio to pulse train converter 20A of FIG. 3. Shown in FIG. 4A are audio amplifier circuit 310A, high frequency triangular wave input terminal 312, audio frequency signal input terminal 314, complimentary audio to pulse train converter 320A, audio to pulse train converter 320B, positive supply voltage V+, negative supply voltage V−, complementary pulse train output 328A, pulse train output 328B, circlotron 40, audio output 90, and audio transducer 100.

Shown within complimentary audio to pulse train converter 320A are differential amplifier 22A and active device pair 24A-26A. Similarly, shown within audio to pulse train converter 320B are differential amplifier 22B and active device pair 24B-26B. Complimentary audio to pulse train converter 320A and audio to pulse train converter 320B function as complementary class-D amplifiers, whereby a high frequency triangular wave is provided at high frequency triangular wave input terminal 312 and an audio frequency signal is provided at audio frequency signal input terminal 314 on audio amplifier circuit 310A. Signal inputs and voltage supplies are taken with reference to ground point G (not shown), unless specified otherwise. The high frequency triangular wave may be a symmetrical and/or asymmetrical triangle wave that is produced by a triangle wave generator (not shown). In one embodiment, a triangle wave generator may be included in audio amplifier circuit 310A. The audio frequency signal at audio frequency signal input terminal 314 may be any audio signal. The frequency of the high frequency triangular wave at high frequency triangular wave input terminal 312 may be at least ten times a highest frequency component of the audio frequency signal. For example, if the audio frequency signal represents high-fidelity music having a frequency range of 5 Hz-25 KHz, then the high frequency triangular wave may be at least 250 KHz. In another embodiment, the high frequency triangular wave may be more than 100 times a highest frequency component of the audio frequency signal. For example, with the audio frequency signal extending to 25 KHz, the high frequency triangular wave may be greater than 2.5 MHz.

Differential amplifier 22B is electrically connected to high frequency triangular wave input terminal 312 at its inverting input, and to audio frequency signal input terminal 314 at its noninverting input. Differential amplifier 22B has a relatively high gain, thereby producing an output that is approximately either high or low, both of which output values indicate a comparative result of the input signals (that is, one being either higher or lower than the other). In another embodiment, differential amplifier 22B may be a comparator. A comparator provides a two-level output which represents the comparison between the signals at the noninverting and the inverting inputs. Active devices 24B and 26B are in a "push-pull" arrangement, acting as switches and being connected in series to conduct current from power sources V+ and V− in an alternating manner. In essence, active devices 24B and 26B perform the function of switches. Active devices 24B and 26B can be solid state devices such as bipolar transistors or MOSFETs, for example. Accordingly, active devices 24B and 26B may be referred to as switches. In the illustrated embodiment, active devices 24B and 26B are complementary devices, with active device 24B being supplied from negative supply voltage V− and active device 26B being supplied from positive supply voltage V+. In another embodiment, active devices 24B and 26B can be vacuum tubes and/or other types of switching devices.

Differential amplifier 22B drives active device pair 24B-26B such that only one active device 24B or 26B is conducting at a time. Because active devices 24B, 26B function as switches and are connected in a complementary manner, and because the signal controlling active devices 24B and 26B is a two-level signal, only one switch is closed at a time. When active device 24B is conducting and active device 26B is non-conducting, the voltage at pulse train output 328B is approximately the value of V−. Similarly, when active device 24B is non-conducting and active device 26B is conducting, the voltage output at pulse train output 328B is approximately the value of V+. A small voltage drop can exist across a semiconductor switch when the semiconductor switch is conducting, or closed. Under some transitory conditions, neither active device 24B nor 26B is conducting. However, it can be preferable that both active devices 24B and 26B not conduct at the same time, or only during short transient periods, as such a condition may draw significant current from V+, through both active devices 24B and 26B, to V−, thereby creating an electronic "crowbar" effect.

As a result of the afore-described operation, audio to pulse train converter 320B produces a two-level waveform at pulse train output 328B which represents a pulse width modulation (PWM) of audio frequency signal input 314. Various two-level waveforms at pulse train output 328B can be referred to as a pulse train or rectangular pulse train, and the pulse width modulation may also be referred to as pulse density modulation or pulse frequency modulation, with the duty cycle of the pulse train being approximately indicative of the instantaneous value of the audio frequency signal at audio frequency signal input terminal 314. Because the signal at pulse train output 328B is being gated by the high frequency triangular wave provided at high frequency triangular wave input terminal 312, pulse train output 328B may also be referred to as a high frequency pulse train with respect to the frequency of the audio signal. As described earlier, this frequency can be more than 100 times a highest frequency component of the audio frequency signal.

In the illustrated embodiment, complementary audio to pulse train converter 320A functions substantially similar to audio to pulse train converter 320B, except the signal at complementary pulse train output 328A is a complement of the signal at pulse train output 328B, as described earlier. In the illustrated embodiment, complementary audio to pulse train converter 320A can be substantially similar to audio to pulse train converter 320A. To provide a complementary output, differential amplifier 22A is coupled to high frequency triangular wave input terminal 312 at its inverting input, and to audio frequency signal input terminal 314 at its non-inverting input. The operation of complementary audio to pulse train converter 320A is substantially identical to that of audio to pulse train converter 320B as described above, producing pulse train output 328B. Accordingly, complementary pulse train output 328A is a complement of pulse train output 328A.

In the illustrated embodiment, complementary pulse train output 328A and pulse train output 328B are electrically connected to circlotron 40. In other embodiments, complementary pulse train output 328A and pulse train output 328B can each be electrically connected to a low pass filter (not shown). The functioning of low pass filters was described earlier, with reference to FIG. 2.

Referring again to FIG. 4A, because each active device 24A, 26A, 24B, 26B is generally in either a state of full conduction or cut-off during operation, there is relatively little power dissipation within complementary audio to pulse train converter 320A and audio to pulse train converter 320B. Accordingly, the electrical efficiency of complementary audio to pulse train converter 320A and audio to pulse train converter 320B may higher than the efficiency of other amplifier circuits. In some embodiments, the electrical efficiency can be greater than 80%. In other embodiments, the electrical efficiency can be 90% or greater.

For simplicity, circlotron 40 is represented as a functional block in FIG. 4A, because a detailed description of the functioning of circlotron 40 was given in FIG. 1. Accordingly, circlotron 40 in FIG. 4A provides audio output 90, which drives audio transducer 100. For simplicity, output reference resistors (not shown) are omitted from FIG. 4A. In the illustrated embodiment, audio transducer 100 is a speaker. In other embodiments, audio transducer 100 can be a speaker network. In some embodiments, audio transducer 100 can be a headphone transducer. In yet other embodiments, audio transducer may be omitted. In those other embodiments, audio output 90 can be provided as an audio input to another circuit.

Figure 4B:
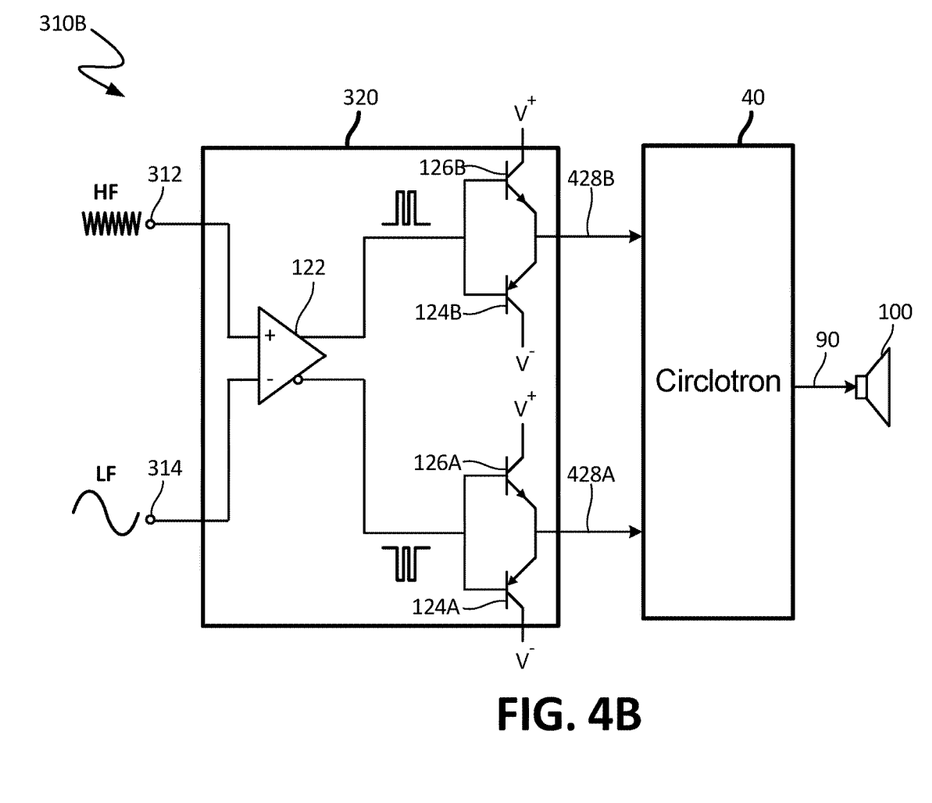
FIG. 4B is a schematic diagram of an alternative embodiment of the first embodiment of the audio to pulse train converter circuit depicted in FIG. 1.

FIG. 4B is a schematic diagram of an alternative embodiment of a first embodiment of the audio to pulse train converter circuit shown in FIG. 1. Shown in FIG. 4B are audio amplifier circuit 310B, high frequency triangular wave input terminal 312, audio frequency signal input terminal 314, audio to pulse train converter 320, positive supply voltage V+, negative supply voltage V−, complementary pulse train output 428A, pulse train output 428B, circlotron 40, audio output 90, and audio transducer 100. Shown within audio to pulse train converter 320 are complementary differential amplifier 122, active device pair 124A-126A, and active device pair 124B-126B. Circlotron 40 is represented as a functional block, as described in FIG. 4A. In the illustrated embodiment, complementary differential amplifier 122 produces two outputs, one being complementary to the other. Therefore, complementary differential amplifier 122 performs substantially the same function of differential amplifiers 22A, 22B shown in FIG. 4A. Accordingly, the functioning of active device pairs 124A-126A and 124B-126B is substantially the same as active device pairs 24A-26A and 24B-26B as shown and described in FIG. 4A. Accordingly, active device pairs 124A-126A and 124B-126B produce complementary pulse train output 428A and pulse train output 428B, respectively, with one being a complement of the other. Complementary pulse train output 428A and pulse train output 428B are therefore substantially similar to complementary pulse train output 328A and pulse train output 328B as described in FIG. 4A.

Figure 5:
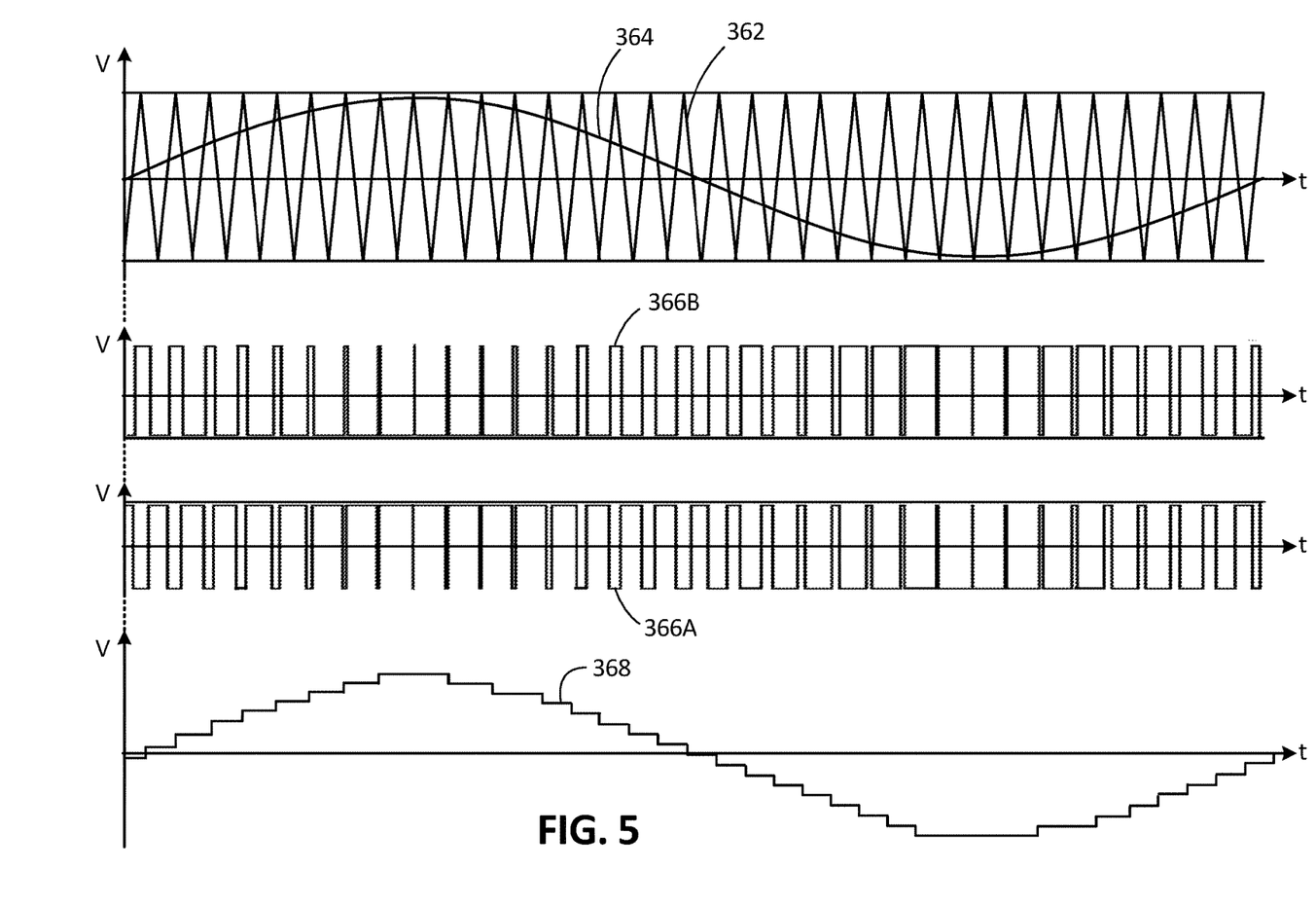
FIG. 5 is a set of waveforms depicting electronic signals at various points in the circuit of FIG. 4A.

FIG. 5 depicts electronic signal waveforms at various circuit points in audio amplifier circuit 310A shown in FIG. 4A during the operation of audio amplifier circuit 310A using exemplary signal inputs. Shown in FIG. 5 are high frequency triangular waveform 362, audio frequency signal waveform 364, complementary pulse train output waveform 366A, pulse train output waveform 366B, and circlotron output waveform 368. On all plots shown in FIG. 5, the vertical axis represents voltage (v) and the horizontal axis represents time (t). High frequency triangular waveform 362 is a plot of voltage over time of the input signal present at high frequency triangular wave input terminal 312 during operation of audio amplifier circuit 310A. Audio frequency signal waveform 364 is a plot of voltage over time of the input signal present at audio frequency signal input terminal 314 during operation of audio amplifier circuit 310A. In the illustrated embodiment, for the sake of simplicity, a single cycle of one audio frequency is depicted as audio frequency signal waveform 364. Also, for the sake of simplicity, reduced frequency of a high frequency triangular wave is depicted for high frequency triangular waveform 362. It can be understood that in some embodiments, such as that described in FIG. 4A, the frequency of a high frequency triangular waveform 362 provided at high frequency triangular wave input terminal 312 can be several orders of magnitude higher than the audio frequency signal waveform 364 provided at audio frequency signal input terminal 314 on audio amplifier circuit 310A.

Complementary pulse train output waveform 366A depicts the signal at complementary pulse train output 328A in the embodiment illustrated in FIG. 4A, and pulse train output waveform 366B depicts the signal at pulse train output 328B in the embodiment shown in FIG. 4A. During operation of audio amplifier circuit 310A (depicted in FIG. 4A), complementary audio to pulse train converter 320A produces a signal that is complementary to that produced by audio to pulse train converter 320B.

Circlotron output waveform 368 depicts the output of audio amplifier circuit 310A present across first output node 46 and second output node 56 in the embodiment shown in FIGS. 1-3. Circlotron output waveform 368 is depicted as being a voltage signal, which can also be the signal at audio output 90 in FIGS. 4A and 4B. Because the operation of circlotron 40 can be to produce a current output through audio transducer 100, circlotron output waveform 368 can also represent a current flow through audio transducer 100. In the illustrated embodiment, circlotron output waveform 368 depicts an amplified version of audio frequency signal waveform 364. High frequency components of circlotron 40 output have been filtered by parasitic capacitance and inductance in audio amplifier circuit 310A, as described earlier in FIGS. 1 and 2. In other embodiments, low-pass filters can be used to filter high frequency components, for example, as shown and described in FIG. 2.

The resulting output of audio amplifier circuit 310A in FIG. 4A is circlotron output waveform 368 shown in FIG. 5. Circlotron output waveform 368 appears as a stair-step waveform that is similar in form to audio frequency signal waveform 364. For ease of illustration, high frequency triangular waveform 362 is shown with a frequency that is approximately 30-40 times the single frequency depicted as audio frequency signal waveform 364. In other embodiments, high frequency triangular waveform 362 can be 100 times, or greater, a highest frequency component of the audio frequency signal waveform 364, as described in FIG. 4A. It is known to those who are skilled in the electrical arts that higher switching frequencies produce a more accurate amplified representation of the audio signal. In those other embodiments, circlotron output waveform 368 can be substantially identical in shape to audio frequency signal waveform 364. Accordingly, in those other embodiments, the amplified output signal provided at audio output 90 (depicted in FIG. 4A) can substantially identical in shape to the input signal at audio frequency signal input terminal 314.

Referring back to FIG. 1, various types of audio amplifiers can be used for audio to pulse train converter 20, so long as they are configured to provide complementary amplified signals. For example, in a second embodiment, audio to pulse train converter 20 can be a sigma-delta amplifier circuit. In a third another embodiment, audio to pulse train converter 20 can be a self-oscillating amplifier circuit.

Figure 6:
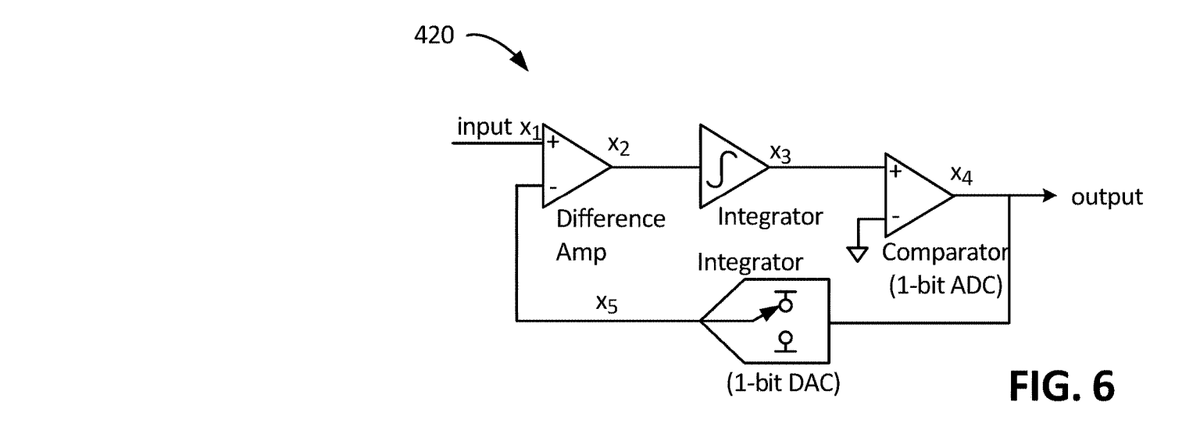
FIG. 6 is a schematic diagram representation of a second embodiment of the audio to pulse train converter circuit depicted in FIG. 3.

FIG. 6 is a schematic diagram representation of a second embodiment of audio to pulse train converter 20 as depicted in FIG. 1. Shown in FIG. 6 is simplified sigma-delta amplifier circuit 420. Sigma-delta amplifier circuit 420 can also be called a delta-sigma amplifier circuit. Those who are skilled in the electrical arts are familiar with delta-sigma modulation, a method that can be used to amplify an audio signal by encoding changes in the signal with a stream of pulses, thereby simplifying circuit design and improving electrical efficiency. As described in FIGS. 1 and 3, audio amplifier circuit 10 will typically employ two sigma-delta amplifier circuits 420, with one being configured to provide a complementary output signal to the other. In other embodiments, a single sigma-delta amplifier circuit 420 having complementary outputs can be used. Those who are skilled in the audio amplifier arts are familiar with the use of a sigma-delta amplifier circuit for providing high-efficiency amplification of audio signals.

Figure 7:
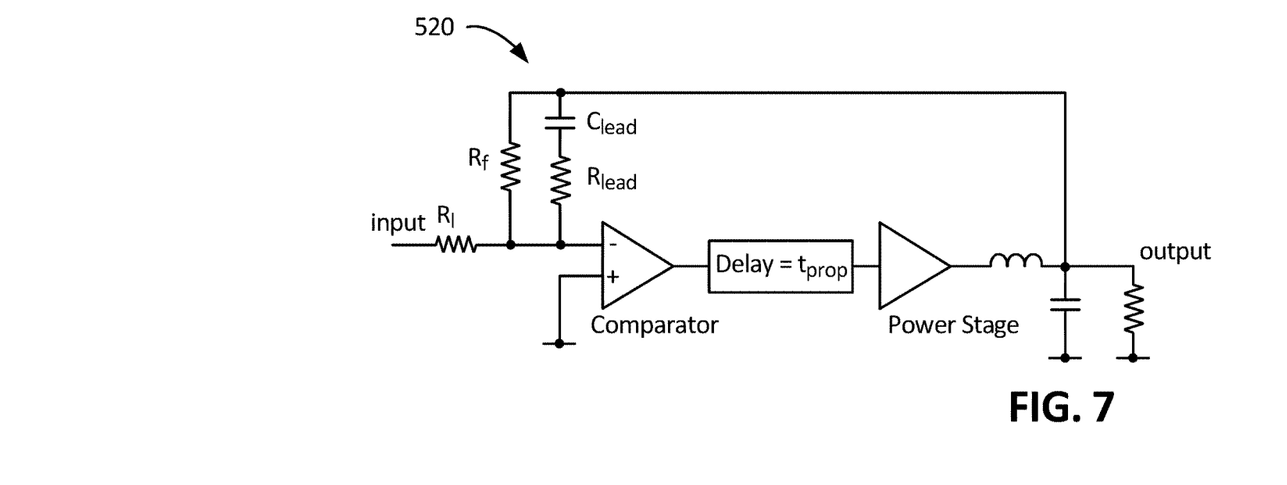
FIG. 7 is a schematic diagram representation of a third embodiment of the audio to pulse train converter circuit depicted in FIG. 3.

FIG. 7 is a schematic diagram representation of a third embodiment of audio to pulse train converter 20 as depicted in FIG. 1. Shown in FIG. 7 is simplified self-oscillating amplifier circuit 520. Those who are skilled in the electrical arts are familiar with self-oscillating amplification, a method that can be used to amplify an audio signal by performing audio to pulse train conversion. In a particular embodiment, a self-oscillator can be referred to as a voltage-controlled oscillator (VCO), with the frequency of oscillation being proportional to or indicative of the instantaneous voltage at the input. As described in FIGS. 1 and 3, audio amplifier circuit 10 will typically employ two self-oscillating amplifier circuits 520, with one being configured to provide a complementary output signal to the other. In other embodiments, a single self-oscillating amplifier circuit 520 having complementary outputs can be used. Those who are skilled in the audio amplifier arts are familiar with the use of a self-oscillating amplifier circuit for providing high-efficiency amplification of audio signals.

Various embodiments of audio to pulse train converter circuits 20 in FIG. 1 have been described in FIGS. 4A, 4B, and 5-7. Variations of the circuits depicted in FIGS. 4A, 4B, 6, and 7, and other types of audio to pulse train conversion circuits are within the scope of the present disclosure. Moreover, all circuit configurations that use either two audio to pulse train conversion circuits or a single audio to pulse train conversion circuit having complementary outputs are within the scope of the present disclosure.

DISCUSSION OF POSSIBLE EMBODIMENTS

The following are non-exclusive descriptions of possible embodiments of the present invention.

A system for producing amplification of an audio signal, the system comprising: an analog to pulse train converter configured to convert an analog audio signal to a complementary train of pulses indicative of the analog audio signal, the analog to pulse train converter receiving the analog signal at an input port and providing the complementary train of pulses at an output port; and a circlotron having two active devices, two power supplies, two complementary input terminals, and two complementary output nodes, wherein each of the active devices has a control node in conductive communication with a respective one of the complementary input terminals, wherein the complementary input terminals are configured to receive the complementary train of pulses; wherein the circlotron is configured to provide, based on the complementary train of pulses, an amplified version of the audio signal at the two output nodes.

The system of the preceding paragraph can optionally include, additionally and/or alternatively, any one or more of the following features, configurations and/or additional components:

A further embodiment of the foregoing system, wherein the two active devices are selected from the group consisting of semiconductor devices and vacuum tube devices.

A further embodiment of the foregoing system, wherein the analog to pulse train converter is comprised of at least one class-D amplifiers.

A further embodiment of the foregoing system, further comprising a triangle wave generator having a frequency.

A further embodiment of the foregoing system, wherein the at least one class-D amplifiers each further include a differential amplifier and two active devices, wherein: the differential amplifier has an output terminal; each of the two active devices has a control terminal; wherein the output terminal is electrically connected to the two control terminals of both of the two active devices; and wherein the two active devices are connected in a push-pull configuration between a positive voltage supply and a negative voltage supply.

A further embodiment of the foregoing system, wherein the differential amplifier is a comparator.

A further embodiment of the foregoing system, wherein the triangle wave frequency at least 100 times a highest frequency component of the audio frequency signal.

A further embodiment of the foregoing system, further comprising a first and a second signal flow path, the first signal flow path being from the pulse train converter, through the first active device, to the first and second output nodes, and the second signal flow path being from the pulse train converter, through the second active device, to the first and second output nodes, wherein at least one low pass filter is in at least one of the signal flow paths.

A further embodiment of the foregoing system, further comprising an output reference resistor, the output reference resistor being electrically connected between the first output node and a ground point.

A further embodiment of the foregoing system, wherein the analog to pulse train converter is comprised of at least one sigma-delta amplifiers.

A further embodiment of the foregoing system, wherein the analog to pulse train converter is comprised of at least one self-oscillating amplifiers.

A method for producing amplification of an audio signal, the method comprising: supplying a first audio signal and a first triangle wave signal to a first audio to pulse train converter; generating, by the first audio to pulse train converter, based on the received first audio frequency signal and the first triangle wave signal, a first pulse train signal indicative of the first audio signal; supplying a second audio signal and a second triangle wave signal to a second audio to pulse train converter; generating, by the second audio to pulse train converter, based on the received second audio frequency signal and the second triangle wave signal, a second pulse train signal indicative of the second audio signal; amplifying, by a circlotron, an amplified version of the audio signal based on a difference between the first pulse train signal and the second pulse train signal; and outputting, from the circlotron, an amplified version of the audio signal.

A further embodiment of the foregoing method, wherein the first and second high frequency triangle wave signals have a frequency at least ten times a highest frequency component of the audio frequency signal.

A further embodiment of the foregoing method, further comprising filtering, via a low pass filter, at least one of the first and second pulse train signals.

A further embodiment of the foregoing method, further comprising referencing an amplified version of the audio signal to an output reference voltage.

A system for producing amplification of a stereo audio signal, the system configured to amplify a left audio signal and a right audio signal, the system including a left channel amplifier and a right channel amplifier, each of the two channel amplifiers comprising: an analog to pulse train converter configured to convert an analog audio signal to a complementary train of pulses indicative of the analog audio signal, the analog to pulse train converter receiving the analog signal at an input port and providing the complementary train of pulses at an output port; and a circlotron having two active devices, two power supplies, two complementary input terminals, and two complementary output nodes, wherein each of the active devices has a control node in conductive communication with a respective one of the complementary input terminals, wherein the complementary input terminals are configured to receive the complementary train of pulses; wherein the circlotron is configured to provide, based on the complementary train of pulses, an amplified version of the audio signal at the two output nodes.

A further embodiment of the foregoing system, wherein the analog to pulse train converters are selected from the group composed of: pulse width modulation amplifier, sigma-delta amplifier, and self-oscillating amplifier.

A further embodiment of the foregoing system, further comprising a first and a second signal flow path, the first signal flow path being from the pulse train converter, through the first active device, to the first and second output nodes, and the second signal flow path being from the pulse train converter, through the second active device, to the first and second output nodes, wherein at least one low pass filter is in at least one of the signal flow paths.

A further embodiment of the foregoing system, further comprising an output reference resistor, the output reference resistor being electrically connected between the first output node and a ground point.

A further embodiment of the foregoing system, wherein the analog to pulse train converter further includes at least one class-D amplifiers, each of the at least one class-D amplifiers further include a differential amplifier and two active devices, wherein: the differential amplifier has an output terminal; each of the two active devices has a control terminal; wherein the output terminal is electrically connected to both of the two control terminals; and wherein the two active devices are connected in a push-pull configuration between a positive voltage supply and a negative voltage supply.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for producing amplification of an analog audio signal, the system comprising:
   an analog to pulse train converter configured to convert the analog audio signal to a complementary train of pulses indicative of the analog audio signal, the analog to pulse train converter receiving the analog audio signal at an input port and providing the complementary train of pulses at an output port; and
   a circlotron having two active devices, two power supplies, two complementary input terminals, and two complementary output nodes, wherein each of the active devices has a control node in conductive communication with a respective one of the complementary input terminals, wherein the complementary input terminals are configured to receive the complementary train of pulses;
   wherein the circlotron is configured to amplify the complementary train of pulses, thereby producing an amplified version of the analog audio signal at the two output nodes.

2. The system of claim 1, wherein the two active devices are selected from the group consisting of semiconductor devices and vacuum tube devices.

3. The system of claim 1, wherein the analog to pulse train converter is comprised of at least one class-D amplifiers.

4. The system of claim 3, further comprising a triangle wave generator having a frequency.

5. The system of claim 3, wherein the at least one class-D amplifiers each further include a differential amplifier and two active devices, wherein:
   the differential amplifier has an output terminal;
   each of the two active devices has a control terminal;
   wherein the output terminal is electrically connected to the two control terminals of both of the two active devices; and
   wherein the two active devices are connected in a push-pull configuration between a positive voltage supply and a negative voltage supply.

6. The system of claim 5, wherein the differential amplifier is a comparator.

7. The system of claim 4, wherein the triangle wave frequency at least 100 times a highest frequency component of the analog audio signal.

8. The system of claim 1, further comprising a first and a second signal flow path, the first signal flow path being from the pulse train converter, through the first active device, to the first and second output nodes, and the second signal flow path being from the pulse train converter, through the second active device, to the first and second output nodes, wherein at least one low pass filter is in at least one of the signal flow paths.

9. The system of claim 1, further comprising an output reference resistor, the output reference resistor being electrically connected between the first output node and a ground point.

10. The system of claim 1, wherein the analog to pulse train converter is comprised of at least one sigma-delta amplifiers.

11. The system of claim 1, wherein the analog to pulse train converter is comprised of at least one self-oscillating amplifiers.

12. A method for producing amplification of an analog audio signal, the method comprising:
   supplying a first audio signal and a first triangle wave signal to a first audio to pulse train converter;
   generating, by the first audio to pulse train converter, based on the received first audio signal and the first triangle wave signal, a first pulse train signal indicative of the first audio signal;
   supplying a second audio signal and a second triangle wave signal to a second audio to pulse train converter;
   generating, by the second audio to pulse train converter, based on the received second audio frequency signal and the second triangle wave signal, a second pulse train signal indicative of the second audio signal, the first and second pulse trains comprising a complementary train of pulses;
   amplifying, by a circlotron, the complementary train of pulses thereby producing an amplified version of the analog audio signal based on a difference between the first pulse train signal and the second pulse train signal; and
   outputting, from the circlotron, the amplified version of the analog audio signal.

13. The method of claim 12, wherein the first and second high frequency triangle wave signals have a frequency at least ten times a highest frequency component of the analog audio signal.

14. The method of claim 13, further comprising filtering, via a low pass filter, at least one of the first and second pulse train signals.

15. The method of claim 10, further comprising referencing an amplified version of the analog audio signal to an output reference voltage.

16. A system for producing amplification of a stereo audio signal, the system configured to amplify a left analog audio signal and a right analog audio signal, the system including a left channel amplifier and a right channel amplifier, each of the two channel amplifiers comprising:
   an analog to pulse train converter configured to convert an analog audio signal to a complementary train of pulses indicative of the analog audio signal, the analog to pulse train converter receiving the analog audio signal at an input port and providing the complementary train of pulses at an output port; and a circlotron having two active devices, two power supplies, two complementary input terminals, and two complementary output nodes, wherein each of the active devices has a control node in conductive communication with a respective one of the complementary input terminals, wherein the complementary input terminals are configured to receive the complementary train of pulses;

wherein the circlotron is configured to amplify the complementary train of pulses, thereby producing an amplified version of the analog audio signal at the two output nodes.

17. The system of claim 16, wherein the analog to pulse train converters are selected from the group composed of: pulse width modulation amplifier, sigma-delta amplifier, and self-oscillating amplifier.

18. The system of claim 16, further comprising a first and a second signal flow path, the first signal flow path being from the pulse train converter, through the first active device, to the first and second output nodes, and the second signal flow path being from the pulse train converter, through the second active device, to the first and second output nodes, wherein at least one low pass filter is in at least one of the signal flow paths.

19. The system of claim 16, further comprising an output reference resistor, the output reference resistor being electrically connected between the first output node and a ground point.

20. The system of claim 16, wherein the analog to pulse train converter further includes at least one class-D amplifiers, each of the at least one class-D amplifiers further include a differential amplifier and two active devices, wherein:

the differential amplifier has an output terminal;
each of the two active devices has a control terminal;
wherein the output terminal is electrically connected to both of the two control terminals; and
wherein the two active devices are connected in a push-pull configuration between a positive voltage supply and a negative voltage supply.

\* \* \* \* \*